(12) United States Patent
Kamijima

(10) Patent No.: US 7,510,978 B2
(45) Date of Patent: Mar. 31, 2009

(54) METHOD FOR FORMING MASK FOR USING DRY-ETCHING AND METHOD FOR FORMING FINE STRUCTURE PATTERN

(75) Inventor: Akifumi Kamijima, Tokyo (JP)

(73) Assignee: TDK Corporation, Tokyo (JP)

( * ) Notice: Subject to any disclaimer, the term of this patent is extended or adjusted under 35 U.S.C. 154(b) by 99 days.

(21) Appl. No.: 11/674,374

(22) Filed: Feb. 13, 2007

(65) Prior Publication Data

US 2008/0190890 A1  Aug. 14, 2008

(51) Int. Cl.
*H01L 21/302* (2006.01)

(52) U.S. Cl. .................. 438/717; 438/706; 438/710; 216/41

(58) Field of Classification Search .......... 438/706, 438/710, 712, 714; 216/41, 47
See application file for complete search history.

(56) References Cited

U.S. PATENT DOCUMENTS

| | | | |
|---|---|---|---|
| 5,648,199 A * | 7/1997 | Kishimura | 430/311 |
| 5,721,078 A | 2/1998 | Kamijima | |
| 5,725,997 A | 3/1998 | Kamijima | |
| 5,747,198 A | 5/1998 | Kamijima | |
| 6,001,537 A * | 12/1999 | Ohsumi et al. | 430/313 |
| 6,635,408 B2 | 10/2003 | Kamijima | |
| 6,720,256 B1 * | 4/2004 | Wu et al. | 438/638 |

FOREIGN PATENT DOCUMENTS

| | | |
|---|---|---|
| JP | 7-45510 | 2/1995 |
| JP | 2003-316026 | 11/2003 |
| JP | 2004-85615 | 3/2004 |

OTHER PUBLICATIONS

U.S. Appl. No. 11/677,245, filed Feb. 21, 2007, Kamijima.
U.S. Appl. No. 11/674,374, filed Feb. 13, 2007, Kamijima.
U.S. Appl. No. 11/671,758, filed Feb. 6, 2007, Kamijima et al.

* cited by examiner

*Primary Examiner*—Lan Vinh
(74) *Attorney, Agent, or Firm*—Oblon, Spivak, McClelland, Maier & Neustadt, P.C.

(57) ABSTRACT

In the invention of this application, the resist pattern having a given pattern of opening concavity is formed on the component to be dry etched, the aqueous solution containing a water-soluble resin is filled in that opening concavity, and the filled aqueous solution containing a water-soluble resin is dried into a narrow shrunk resin at the middle of the opening concavity, whereby the mask of shrunk resin is formed. It is thus possible to form a micropattern much finer than determined by optical limits.

8 Claims, 5 Drawing Sheets

METHOD FOR FORMING MASK FOR USING DRY-ETCHING AND METHOD FOR FORMING FINE STRUCTURE PATTERN

BACKGROUND OF THE INVENTION

1. Field of the Invention

The present invention relates to a process for the formation of a dry etching mask used for the formation of a pattern much finer than determined by optical limits, and a process for the formation of a micropattern using that mask.

2. Explanation of the Prior Art

One of processes for the formation of finely patterned thin films (micropatterns), for instance, is typified by a dry etching process. According to this process, for instance, a thin film is formed on a substrate, a resist layer is formed on that thin film, and that resist layer is patterned by photolithography into a finely patterned resist mask. Then, while that resist is used as a dry etching mask, an exposed portion of the thin film is dry etched off, after which the resist is stripped off to obtain a finely patterned thin film.

The finely patterned thin films formed by such a dry etching process, for instance, are used for micro-components, micro-layer members, interconnection patterns or the like that constitute microdevices such as thin-film inductors, thin-film magnetic heads, semiconductor devices, sensors using thin films, and actuators using thin films.

In recent years, there have been growing demands toward making microdevices much finer and, with this, toward microprocessing techniques for achieving much narrower pattern widths. For activation light rays used for the formation of mask patterns, too, excimer laser light such as KrF, ArF, and $F_2$ as well as short wavelength irradiation light such as electron radiation have been put to practical use or studied.

With prior art dry etching processes, however, it is still theoretically impossible to form a pattern thin film much finer than determined by optical limits, because a micropattern thin film is formed using as a dry etching mask a resist pattern obtained by the patterning of a resist layer with an optical method.

The situations being like such, the present invention has been made for the purpose of providing a process of forming a dry etching mask capable of forming a micropattern much finer than determined by optical limits. Another object of the invention is to provide a process of forming a micropattern using that mask.

SUMMARY OF THE INVENTION

According to the invention, such objects as mentioned above are achieved by the provision of a process of forming a mask for dry etching for the formation of a micropattern, comprising a step of providing a component to be dry etched, a resist pattern formation step of forming a resist pattern on the component to be dry etched in such a way was to provide a given pattern of opening concavity, a water-soluble resin filling step of filling an aqueous solution containing a water-soluble resin in said opening concavity, and a shrunk resin mask formation step of drying the water-soluble resin-containing aqueous solution filled in said opening concavity, thereby forming a narrow shrunk resin at the middle of the opening concavity.

In a preferable embodiment of the mask formation process according to the invention, at the step of providing the component to be dry etched, the component to be dry etched is formed in a film form on a substrate.

In a preferable embodiment of the mask formation process according to the invention, the content of the water-soluble resin is 0.5 to 20 wt %.

In a preferable embodiment of the mask formation process according to the invention, the water-soluble resin is a water-soluble fiber.

In a preferable embodiment of the mask formation process according to the invention, the water-soluble fiber is one selected from the group consisting of pectins, glucomannans, and alginic acids.

The present invention also provides a process of forming a micropattern on a substrate using the aforesaid dry etching mask formation process, comprising a step of providing a substrate, a thin film formation step of forming a thin film on the substrate, which provides a base for the micropattern and is the component to be dry etched, a resist pattern formation step of forming a resist pattern on the thin film to be dry etched in such a way as to provide a given pattern of opening concavity, a water-soluble resin filling step of filling a water-soluble resin in said opening concavity, a shrunk resin mask pattern formation step of drying the water-soluble resin filled in said opening concavity thereby forming a narrow shrunk resin in such a way as to come near to the middle of the opening concavity, a dry etching step of dry etching the thin film to be dry etched using as a mask a mask pattern of shrunk resin formed at said shrunk resin mask formation step, a step of removal of the resist pattern and shrunk resin mask, and a step of removing the thin film underlying the resist pattern.

Furthermore, the invention provides a process of forming a micropattern on a substrate using the aforesaid dry etching mask formation process, comprising a step of providing a substrate, a thin film formation step of forming a thin film on the substrate, which provides a base for the micropattern and is the component to be dry etched, a resist pattern formation step of forming a resist pattern on the thin film to be dry etched in such a way as to provide a given pattern of opening concavity, a water-soluble resin filling step of filling a water-soluble resin in said opening concavity, a shrunk resin mask pattern formation step of drying the water-soluble resin filled in said opening concavity thereby forming a narrow shrunk resin in such a way as to come near to the middle of the opening concavity, a step of removal of the resist pattern and shrunk resin mask, a step of removal of the resist pattern, and a dry etching step of dry etching the thin film to be dry etched using as a mask a mask pattern of shrunk resin formed at said shrunk resin mask formation step.

According to the invention of this application, the resist pattern having a given pattern of opening concavity is formed on the component to be dry etched, the aqueous solution containing a water-soluble resin is filled in that opening concavity, and the filled aqueous solution containing a water-soluble resin is dried into a narrow shrunk resin at the middle of the opening concavity, whereby the mask of shrunk resin is formed. It is thus possible to form a micropattern much finer than determined by optical limits.

EXPLANATION OF THE INVENTION

The best mode for carrying out the invention is now explained in details.

The process of forming the dry etching mask according to the invention is a mask formation process that is capable of forming a micropattern much finer than determined by optical limits.

Figure 1A:
FIGS. 1A through 1H are illustrative in section and with time of the process of forming a dry etching mask according to the invention and the process of forming a micropattern using that mask; they are corresponding to sectional views sectioned on the X plane shown in FIG. 2.
Figure 1B:
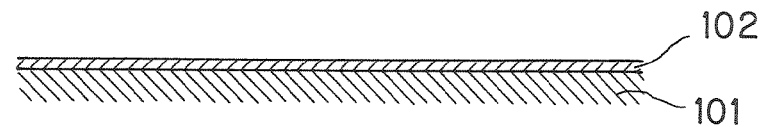

A preferable embodiment of the mask formation process is now explained in greater details for each process step with reference to the drawings. FIGS. 1A through 1H are illustrative, in section and with time, of the process of forming the dry etching mask according to the invention and the process of forming a micropattern using that mask. In particular, FIGS. 1C, 1D, 1E and 1F are corresponding to sectional views illustrative of a substantially I-shaped trench pattern of a linear narrow groove portion by which two such blocks as shown in FIG. 2 are joined together, as sectioned on the X-plane.

(1) Step of Having the Component to be Dry Etched at the Ready.

First of all, the component to be dry etched is provided at the ready. For instance, the component to be dry etched is obtained by forming a thin film 102 on a previously provided substrate 101 (FIG. 1A) (FIG. 1B). By way of example but not by way of limitation, the thin film may be formed by sputtering, CVD or the like. Usually, the thin film 102 is formed of various electro-conductive materials for pattern formation. That thin film, for instance, may be a magnetic thin film.

In general, the component to be dry etched is usually in a thin-film form; however, that component need not be a thin film. For instance, a suitable component may be chosen depending on which portion of a microdevice is to be processed.

(2) Step of Forming a Resist Pattern

Figure 1C:
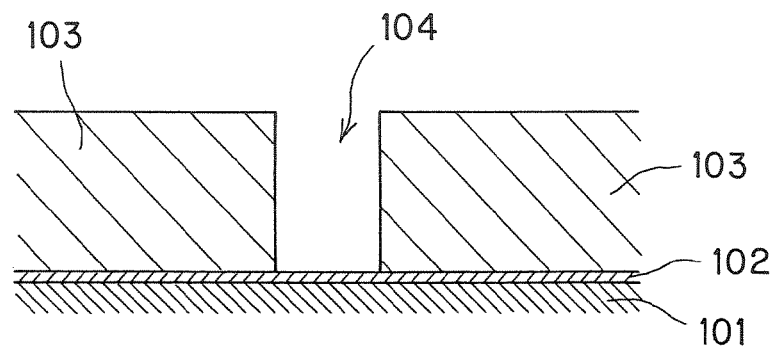
Figure 2:
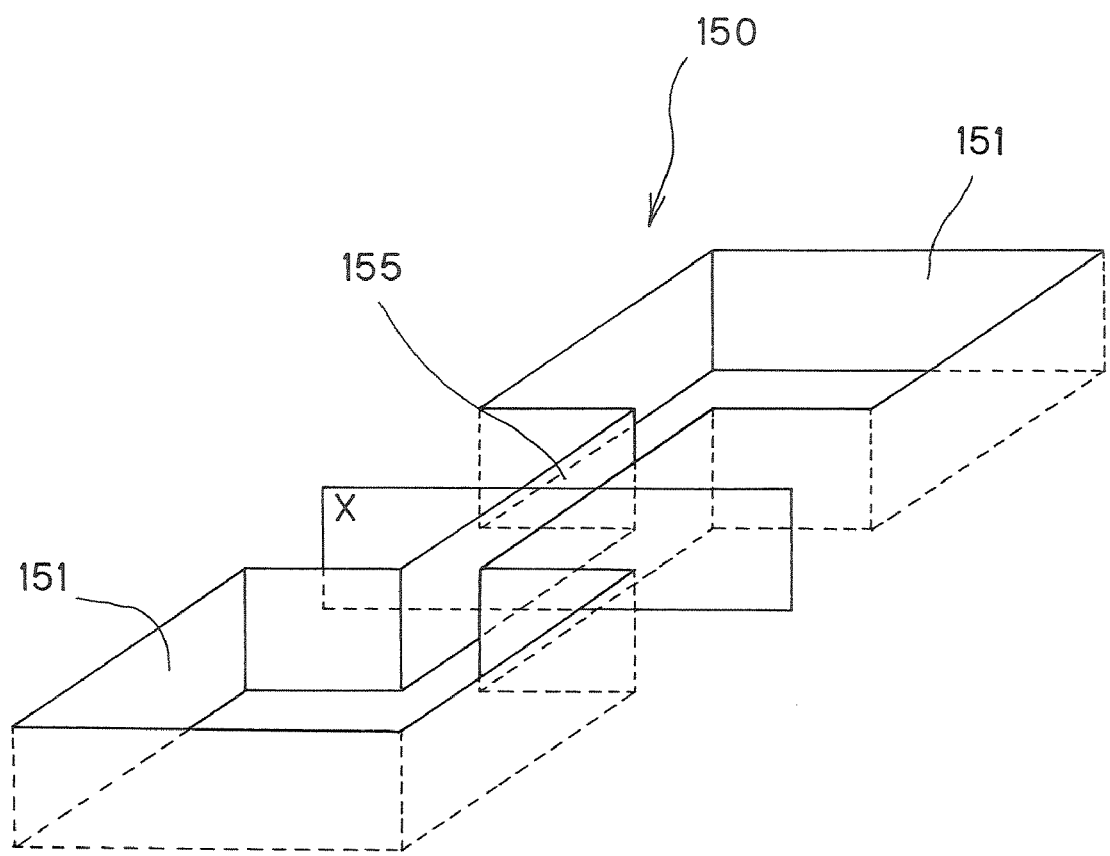
FIG. 2 is illustrative in perspective of one example of the trench pattern formed with a resist.

Then, as depicted in FIG. 1C, a resist pattern 103 is formed on the component to be dry etched (here the thin film 102) in such a way as to provide a given pattern of opening concavity 104.

To be more specific, a photoresist is coated on the component (thin film 102) to be dry etched by means of spin coating as an example, after which, if required, the photoresist is heated (baked) to form a photoresist film. Then, photolithography is used to pattern the photoresist film (selective exposure and development for pattern formation), thereby forming a resist pattern 103 (resist 103). Thus, the given pattern of opening concavity 104 is formed.

The given pattern of opening concavity 104 may be a substantially I-shaped trench pattern 150 such as that depicted in FIG. 2. However, that opening concavity need not be limited to it, and so may take on various forms. The trench pattern 150 depicted in FIG. 2 is made up of two trenches 151, 151 of typically 1 mm square joined to each other by a narrow groove 155 of 0.2 μm in width and 1 μm in length, as exemplified later, with a trench depth of typically 0.5 μm.

The opening concavity 104 depicted in FIG. 1C should be thought of as being corresponding to one section of the narrow groove 155 depicted in FIG. 2.

(3) Water-Soluble Resin Filling Step

Figure 1D:
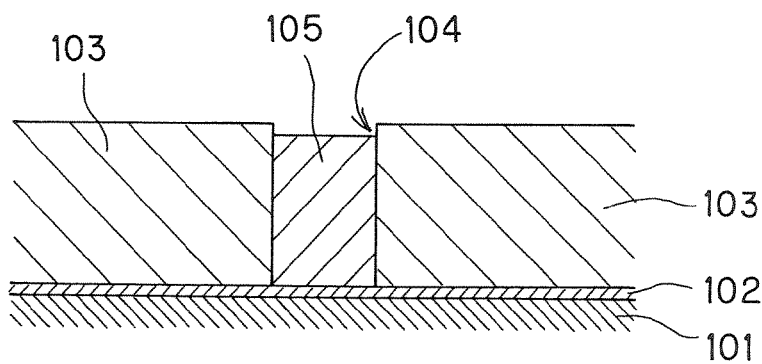

Then, as depicted in FIG. 1D, there is the water-soluble resin filling step carried out to fill the opening concavity 104 (trench pattern 150) with an aqueous solution containing a water-soluble resin. Preferably but not exclusively, the aqueous solution 105 containing a water-soluble resin should be filled in the opening concavity 104 by means of an injection technique using a pipette or micro-syringe or an bubble jet injection technique.

For the water-soluble resin it is preferable to use a water-soluble fiber. More preferably, at least one should be selected from the group consisting of pectins, glucomannans and alginic acids, which may be used in admixture of two or more. More practical and more easily available is agar (composed mainly of agaropectin).

The aqueous solution 105 should have a water-soluble resin content of about 0.5 to 20 wt %. As that content is less than 0.5 wt %, there is inconvenience such as the inability of the solidified resin to function as a satisfactory mask. As the content is greater than 20 wt %, on the other hand, there is inconvenience such as difficulty in injecting the aqueous solution into the opening concavity 104 (trench pattern 150).

The aqueous solution 105 containing such a water-soluble resin may additionally have additives such as surfactants, and the aqueous solution of the water-soluble resin may have been warmed up.

(4) Step of Forming a Mask of Shrunk Resin

Figure 1E:
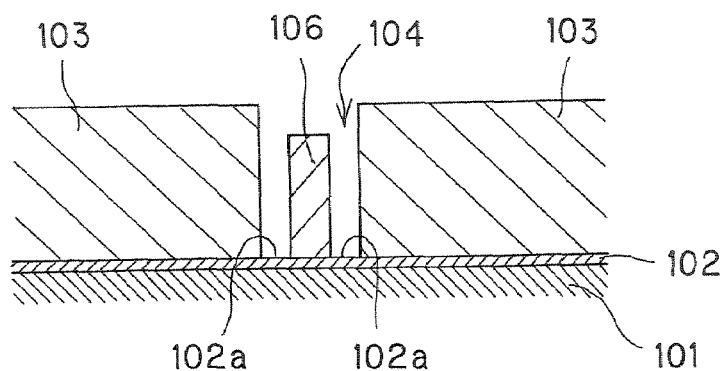

Then, the water-soluble resin-containing aqueous solution 105 is dried in the opening concavity 104 to form a narrow mask of shrunk resin at the middle of the opening concavity. In the invention, the drying treatment rids the aqueous solution of moisture, so that the water-soluble resin starts solidifying, and shrinks and comes near to the middle of the opening concavity 104. As perfect dryness is reached, a narrow shrunk resin 106 (water-soluble resin) is formed at the middle of the opening concavity (FIG. 1E). As a result of the inventors' study after study, it has experimentally be found that the aforesaid respective resins have the property of shrinking and moving toward the middle of the opening concavity 104 as they are kept drying on.

Preferably but not exclusively, the water-soluble resin-containing aqueous solution 105 should be dried by spontaneous drying, heat drying, vacuum drying or the like. After the given drying treatment, ashing may be carried out to make the shrunk resin 106 (water-soluble resin) much narrower.

Note here that the shrunk resin 106 depicted in FIG. 1E is drawn as a perfect rectangular form with no trail around its base; however, indeed, there are some trails around the base just as found around the base of a mountain. Even with some rugged trails around the base, however, there would be no problem, because such a trail problem can be overcome by the regulation of etching time.

Through such steps, there is a dry etching mask (shrunk resin 106) formed, which is capable of forming a micropattern much finer than determined by optical limits.

Figure 1F:
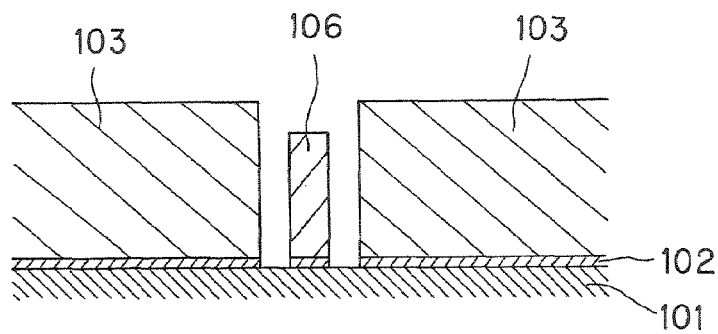
Figure 1G:
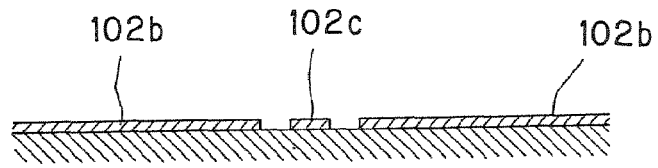
Figure 1H:
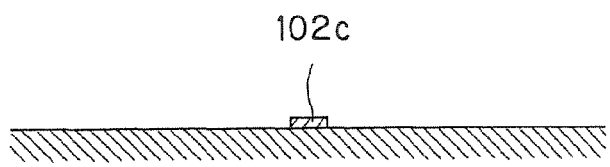

Reference is now made to how to form a micropattern using the thus formed dry etching mask (shrunk resin 106) (see FIGS. 1F through 1H).

[Formation of the Micropattern]

(Dry Etching Step)

Subsequent to the step (FIG. 1E) of forming a mask pattern of shrunk resin, at which there is a dry etching mask (shrunk resin 106) formed, capable of forming a micropattern much finer than determined by optical limits, a dry etching step is carried out, as depicted in FIG. 1F.

At the dry etching step, the mask pattern of shrunk resin 106 is used as a mask to dry etch the thin film 102 to be dry etched, as depicted in FIG. 1F. That is, a thin film 102a at the bottom of the opening concavity 104 and at a gap with no shrunk resin 106 found is etched off.

Dry etching here may be implemented by means of milling, reactive ion etching (RIE) or the like.

(Step of Removal of the Resist Pattern and Shrunk Resin Mask)

Then, as depicted in FIG. 1G, the step of removal of the resin pattern, viz., the resist pattern 103 and mask of shrunk resin 106 is carried out.

These resin patterns may be stripped off, using an organic solvent or the like.

Step of Removal of the Thin Film Underlying the Resist Pattern)

Then, as depicted in FIG. 1H, the step of removal of a thin film 102b (see FIG. 1G) underlying the resist pattern is carried out. For removal of the thin film 102b, for instance, a thin film 102c to remain as a micropattern is covered up with a resist and a resist pattern is formed in such a way as to expose only the thin film 102b. Afterwards, the thin film 102b is dry etched off. Thereafter, as the resist pattern is removed, it allows a micropattern 102c depicted in FIG. 1H to be formed.

This micropattern 102c is much finer than determined by optical limits.

[Second Process of Forming the Micropattern]

The second process of forming the micropattern using the dry etching mask (shrunk resin 106) formed according to the invention is now explained with reference to FIGS. 3A through 3H.

The steps of forming the dry etching mask (shrunk resin 106) are shown in FIGS. 3A to 3E in order, and these steps depicted in FIGS. 3A to 3E are much the same as those already described with reference to FIGS. 1A to 1E; the explanations of the steps of FIGS. 3A to 3E here are left out. The steps that are part of the second process of forming the micropattern are now explained in more details with reference to FIGS. 3F to 3H.

(Step of Removal of the Resist Pattern)

Through the steps of FIGS. 3A to 3E, there is a dry etching mask (shrunk resin 106) formed, capable of forming a micropattern much finer than determined by optical limits. Thereafter, the step of removal of the resist pattern is carried out, as depicted in FIG. 3F.

Figure 3A:
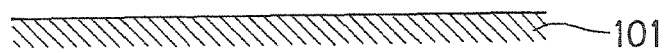
FIGS. 3A through 3H are illustrative in section and with time of the process of forming a dry etching mask according to the invention and the process of forming a micropattern using that mask; for instance, they are corresponding to sectional views sectioned on the X plane shown in FIG. 2.
Figure 3B:
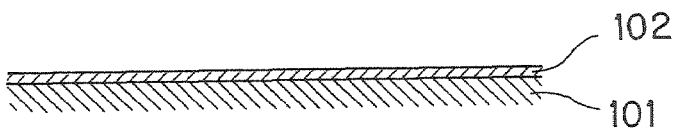
Figure 3C:
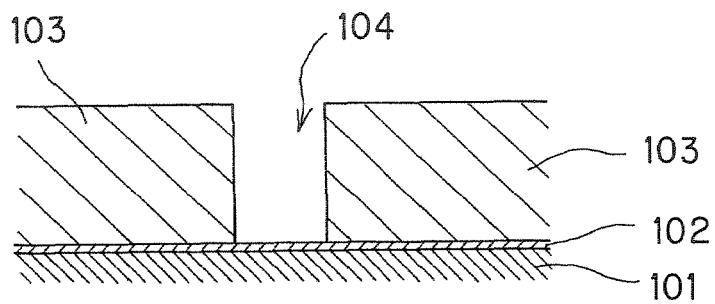
Figure 3D:
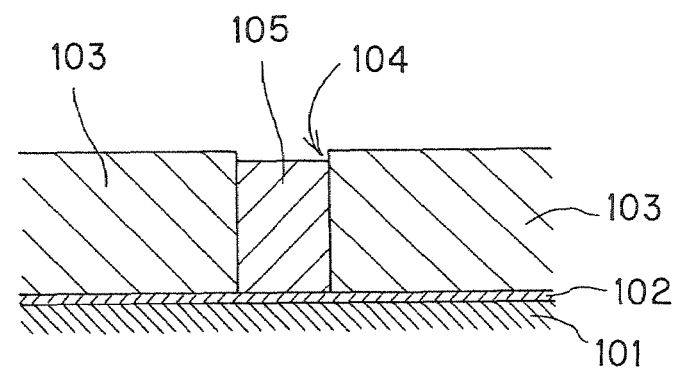
Figure 3E:
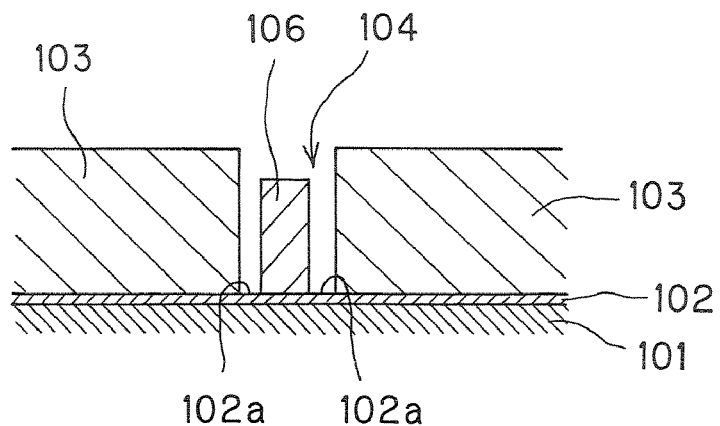
Figure 3F:
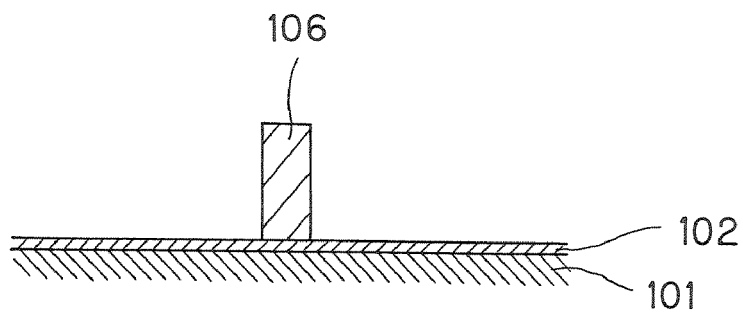

At the step depicted in FIG. 3F, only the resist pattern 103 is stripped off by an organic solvent or the like. It is then required to select the stripping solvent in such a way as to keep the mask pattern of shrunk resin 106 intact. Choice of resist material, and material choice for the shrunk resin 106 is important in view of the stripping solvent, too.

(Dry Etching Step)

Figure 3G:
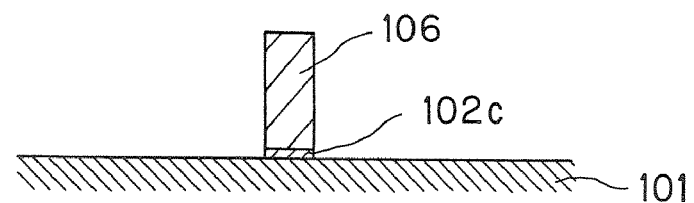

Then, as depicted in FIG. 3G, the mask pattern of shrunk resin 106 is used as a mask to dry etch the thin film 102 to be dry etched (dry etching step). At this step, a portion of the thin film 102 with no shrunk resin 106 deposited to it is substantially dry etched off.

For instance, dry etching here may be implemented by means of milling, or reactive ion etching (RIE).

(Step of Removal of the Shrunk Resin Mask)

Figure 3H:
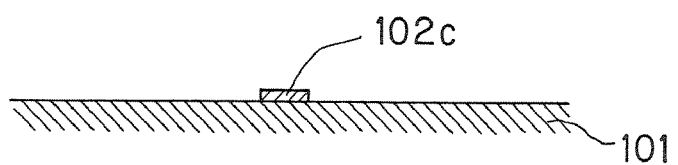

Then, as depicted in FIG. 3H, the step of removal of the mask of shrunk resin 106 is carried out.

The shrunk resin 106 may be stripped off, using an organic solvent or the like selected while taking the resin forming it into account.

The invention is now explained in further details with reference to some specific examples.

An experiment wherein the dry etching mask of the invention was actually formed, and an experiment wherein the thus formed mask was actually used to form a micropattern was carried out.

Each one was formed as follows.

First of all, a silicon substrate, 6 inch φ and 2 mm thick, was provided at the ready.

Then, a 10 nm thick Ta film—the component to be dry etched was formed by sputtering on that silicon film.

Then, a resist pattern for the formation of such a substantially I-shaped trench pattern 150 as depicted in FIG. 2 was formed on that Ta film. That is, a resist (AZ DX5400P Series made by AZ Electro-Materials Co., Ltd.) was coated on the Ta film (thin film 102)—the component to be dry etched, and prebaking was carried out at a temperature of 90° C. for 90 seconds to form a 0.5 μm thick resist film. Then, exposure, PEB and development were performed under the following conditions.

[Exposure]

Aligner: NSR-TFHEX14D made by Nikon Co., Ltd.
Exposure wavelength: λ=248 nm
The mask used: Binary Crear Line of 0.2 μm in width and 1 μm in length+two Crear Boxes, 1 mm square
Exposure conditions: NA=0.65 Sigma=0.7
Dose=ca. 50 mJ/cm$^2$
Focus=0 μm

[PEB (Post Exposure Bake)]

After exposure, baking was carried out at a temperature of 100° C. for 90 seconds.

[Development]

Development was carried out at one paddle using a developer comprising a 2.38% TMAH (tetramethyl anhydrite) aqueous solution.

By the obtained resist pattern, the trench pattern 150 was formed as depicted in FIG. 2. This trench pattern was in a form comprising two 1 mm square trenches 151, 151 joined together by means of a narrow groove 155 of 0.2 μm in width and 1 μm in length, with a trench depth of 0.5 μm. Note here that the portion of narrow groove 155 is corresponding to the opening concavity 104 depicted in FIG. 1C.

Then, the obtained trench pattern (opening concavity 104) was filled up with the aqueous solution 105 containing a water-soluble resin. That is, an aqueous solution containing 10 wt % agar (composed mainly of agaropectin) was cast in the 1 mm square trench portion by means of an injection needle, thereby casting the agar aqueous solution all over the trench pattern.

Then, the water-soluble resin-containing aqueous solution filled in the trench pattern was spontaneously dried for 24 hours. By this drying treatment, the water-soluble resin in the aqueous solution started solidifying, and shrunk and moved toward the middle of the opening concavity 104. As perfect dryness was reached, the narrow shrunk resin 106 (water-soluble resin) was formed at the middle of the opening concavity (see FIG. 1E). That is, there was a line agar mask pattern (shrunk resin 106) of 50 nm in width and 125 nm in height obtained at a portion positioned at the narrow groove 155 (FIG. 2) and a site corresponding to the opening concavity 104 depicted in FIG. 1E.

Then, the obtained agar mask pattern (shrunk resin 106) was used as a mask for the dry etching of the thin film 102—the component to be dry etched. That is, the thin film 102a at the bottom of the opening concavity 104 depicted in FIG. 1F and at a gap portion with no shrunk resin 106 found was dry etched off by means of milling (FIG. 1F).

Set out just below are the milling device and the milling conditions.

[Milling]
Milling device: IBE-IBD made by Veeco Co., Ltd.
Milling conditions
The gas used: Ar
Gas flow rate: 10 SCCM
Pressure: $2\times10^{-4}$ Torr
Milling angle: 90°
Beam current: 200 mA
Beam voltage: 200 V DC
Accelerating voltage: −300 V Then, as depicted in FIG. 1G, the resin pattern was removed: the resist pattern 103 and the mask of shrunk resin 106 were stripped off by dipping and shaking in IPA (isopropyl alcohol).

Then, as depicted in FIG. 1H, the step of removal of the thin film 102 (see FIG. 1G) underlying the resist pattern was carried out. To this end, the thin film 102*c* to remain as a micropattern was covered up with a resist and a resist pattern was formed in such a way as to expose only the thin film 102*b*. Afterwards, the thin film 102*b* was dry etched off. Thereafter, the resist pattern was removed to form the micropattern 102*c* depicted in FIG. 1H.

This micropattern 102*c* was a 45 nm wide Ta pattern much finer than determined by optical limits.

From the aforesaid results of experimentation, the advantages of the invention could be appreciated. That is, according to the invention of this application, the resist pattern having a given pattern of opening concavity is formed on the component to be dry etched, the aqueous solution containing a water-soluble resin is filled in that opening concavity, and the filled aqueous solution containing a water-soluble resin is dried into a narrow shrunk resin at the middle of the opening concavity, whereby the mask of shrunk resin is formed. It is thus possible to form a micropattern much finer than determined by optical limits.

What is claimed is:

1. A process of forming a micropattern on a substrate comprising:
    forming a thin film on a substrate, which provides a base for the micropattern and is a component to be dry etched,
    forming a resist pattern on the thin film to be dry etched so as to provide a given pattern of opening concavity,
    filling a water-soluble resin in said opening concavity,
    drying the water-soluble resin filled in said opening concavity thereby forming a narrow shrunk resin mask in such a way as to come near to a middle of the opening concavity,
    dry etching the thin film to be dry etched using as a mask said shrunk resin mask,
    removing the resist pattern and shrunk resin mask, and
    removing the thin film underlying the resist pattern.

2. The process of claim 1, wherein said opening concavity is filled with said water-soluble resin by filling an aqueous solution having a water-soluble resin content of 0.5 to 20 wt % in said opening concavity.

3. The process of claim 2, wherein said water-soluble resin is a water-soluble fiber.

4. The process of claim 3, wherein said water-soluble fiber is selected from the group consisting of pectins, glucomannans, and alginic acids.

5. A process of forming a micropattern on a substrate comprising:
    forming a thin film on a substrate, which provides a base for the micropattern and is a component to be dry etched,
    forming a resist pattern on the thin film to be dry etched so as to provide a given pattern of opening concavity,
    filling a water-soluble resin in said opening concavity,
    drying the water-soluble resin filled in said opening concavity thereby forming a narrow shrunk resin mask in such a way as to come near to a middle of the opening concavity,
    removing the resist pattern and shrunk resin mask,
    removing the resist pattern, and
    dry etching the thin film to be dry etched using as a mask said shrunk resin mask.

6. The process of claim 5, wherein said opening concavity is filled with said water-soluble resin by filling an aqueous solution having a water-soluble resin content of 0.5 to 20 wt % in said opening concavity.

7. The process of claim 6, wherein said water-soluble resin is a water-soluble fiber.

8. The process of claim 7, wherein said water-soluble fiber is selected from the group consisting of pectins, glucomannans, and alginic acids.

* * * * *